(12) United States Patent
Yu et al.

(10) Patent No.: US 10,181,303 B2
(45) Date of Patent: Jan. 15, 2019

(54) SHIFT REGISTER CIRCUIT WITH TWO DISCHARGING MODULES

(71) Applicants: HANNSTAR DISPLAY (NANJING) CORPORATION, Nanjing (CN); HANNSTAR DISPLAY CORPORATION, Taipei (TW)

(72) Inventors: Chia-Hua Yu, New Taipei (TW); Sung-Chun Lin, Tainan (TW); Hsuan-Chen Liu, Kaohsiung (TW); Chien-Ting Chan, Tainan (TW)

(73) Assignees: HANNSTAR DISPLAY (NANJING) CORPORATION, Nanjing (CN); HANNSTAR DISPLAY CORPORATION, Taipei (TW)

( * ) Notice: Subject to any disclaimer, the term of this patent is extended or adjusted under 35 U.S.C. 154(b) by 94 days.

(21) Appl. No.: 15/013,613

(22) Filed: Feb. 2, 2016

(65) Prior Publication Data
US 2016/0240265 A1    Aug. 18, 2016

(30) Foreign Application Priority Data

Feb. 13, 2015   (CN) .......................... 2015 1 0079752

(51) Int. Cl.
*G09G 3/36*        (2006.01)
*G11C 19/28*       (2006.01)

(52) U.S. Cl.
CPC .......... *G09G 3/3677* (2013.01); *G11C 19/287* (2013.01); *G09G 2300/0408* (2013.01); *G09G 2310/0286* (2013.01)

(58) Field of Classification Search
CPC ... G09G 2300/0408; G09G 2310/0286; G09G 3/3677; G11C 19/287
See application file for complete search history.

(56) References Cited

U.S. PATENT DOCUMENTS

| | | | | |
|---|---|---|---|---|
| 2004/0189585 A1* | 9/2004 | Moon | .................... | G11C 19/28 345/100 |
| 2009/0303211 A1* | 12/2009 | Hu | .......................... | G11C 19/28 345/204 |
| 2014/0055332 A1* | 2/2014 | Yamashita | ........... | G09G 3/3674 345/100 |
| 2014/0204009 A1* | 7/2014 | Kim | ..................... | G09G 3/3677 345/92 |

* cited by examiner

*Primary Examiner* — Chun-Nan Lin
(74) *Attorney, Agent, or Firm* — Muncy, Geissler, Olds & Lowe, P.C.

(57) ABSTRACT

A shift register circuit is disclosed. The shift register circuit includes a first gate driving module, a second gate driving module, a first discharging module, and a second discharging module. The first gate driving module has a first node and a first output terminal. The second gate driving module has a second node and a second output terminal. The first discharging module is coupled to the first node, the second node, and the first output terminal respectively. The second discharging module is coupled to the second node, the first node, and the second output terminal respectively. Both the first discharging module and the second discharging module include ten transistors respectively.

7 Claims, 5 Drawing Sheets

SHIFT REGISTER CIRCUIT WITH TWO DISCHARGING MODULES

BACKGROUND OF THE INVENTION

1. Field of the Invention

This invention relates to a display panel, especially to a bidirectional shift register circuit used in a gate driving circuit of a display panel.

2. Description of the Prior Art

In recent years, with the continuous progress of TFT-LCD panel technology, driving circuits can be integrated on the panel through the system on glass (SOG) technology.

For example, the driving circuits integrated on the panel can be formed by the amorphous silicon (a-Si) manufacturing process or low temperature poly-silicon (LTPS) manufacturing process, and the largest differences between them are electrical properties and manufacturing process complexity. Although the LTPS thin-film transistor has higher carrier mobility, its manufacturing process is quite complicated. The a-Si thin-film transistor has poor carrier mobility, but its manufacturing process is simpler and mature; therefore, the a-Si thin-film transistor has advantages of cost.

However, the threshold voltage of the a-Si thin-film transistor will be affected by a bias and rise gradually due to the limitations of process capability; therefore, the SOG technology fails to be achieved.

Figure 1:
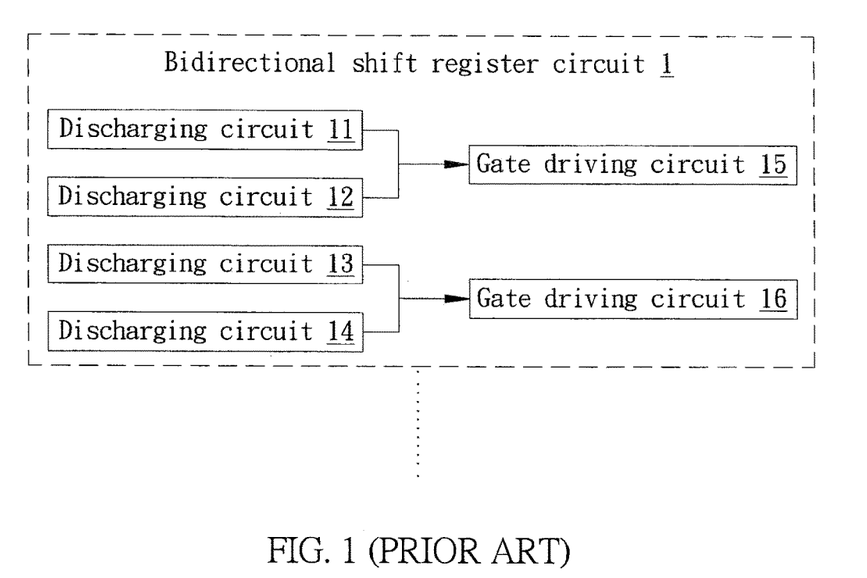
FIG. 1 illustrates a schematic diagram of the conventional bidirectional shift register circuit.

Please refer to FIG. 1. FIG. 1 illustrates a schematic diagram of the conventional bidirectional shift register circuit. As shown in FIG. 1, in the conventional bidirectional shift register circuit 1, the gate driving circuit 15 needs two same discharging circuits 11 and 12 to discharge in turn to stabilize the desired voltage level. Similarly, the gate driving circuit 16 also needs two same discharging circuits 13 and 14 to discharge in turn to stabilize the desired voltage level, and so on.

It is assumed that the conventional bidirectional shift register circuit 1 is formed by a-Si thin-film transistors, if the threshold voltages of some a-Si thin-film transistors are shifted, with increasing of using time, the operation of the conventional bidirectional shift register circuit 1 would be seriously affected by the threshold voltage shift of these a-Si thin-film transistors, even the conventional bidirectional shift register circuit 1 would be failed.

In addition, because the designs of ultra high definition and slim border are required in current display panel of the high-end mobile phones and the tablet PC, dummy gate drivers should be additionally disposed in the conventional bidirectional shift register circuit 1, and it will cause poor reliability issue of the conventional bidirectional shift register circuit 1.

SUMMARY OF THE INVENTION

Therefore, the invention provides a shift register circuit to solve the above-mentioned problems.

An embodiment of the invention is a shift register circuit. In this embodiment, the shift register circuit includes a first gate driving module, a second gate driving module, a first discharging module and a second discharging module. The first gate driving module has a first node and a first output terminal. The second gate driving module has a second node and a second output terminal. The first discharging module is coupled to the first node, the second node, and the first output terminal respectively. The second discharging module is coupled to the second node, the first node, and the second output terminal respectively. Both the first discharging module and the second discharging module include ten transistors respectively.

In an embodiment, both the first discharging module and the second discharging module include a discharge control unit and a level pull-low unit coupled to each other respectively.

In an embodiment, the discharge control unit includes a first transistor, a second transistor, a third transistor, a fourth transistor, a fifth transistor, and a sixth transistor coupled to each other.

In an embodiment, gate electrodes of the first transistor and the fourth transistor are coupled to the first node of the first gate driving module.

In an embodiment, gate electrodes of the second transistor and the third transistor are coupled to the second node of the second gate driving module.

In an embodiment, the fifth transistor is coupled to the first transistor and a gate electrode of the fifth transistor is coupled to the sixth transistor.

In an embodiment, the sixth transistor is coupled to the second transistor, the third transistor and the fifth transistor; a gate electrode of the sixth transistor is coupled to the second transistor, the first transistor and the fifth transistor.

In an embodiment, the level pull-low unit includes a seventh transistor, an eighth transistor, a ninth transistor and a tenth transistor; gate electrodes of the seventh transistor, the eighth transistor, the ninth transistor and the tenth transistor are all coupled to the discharge control unit.

In an embodiment, the seventh transistor is coupled to the first node of the first gate driving module and the eighth transistor is coupled to the first output terminal of the first gate driving module.

In an embodiment, the ninth transistor is coupled to the second node of the second gate driving module and the tenth transistor is coupled to the second output terminal of the second gate driving module.

Compared to the prior art, the shift register circuit of the invention uses a novel gate driving circuit layout to integrate the discharging circuits of two gate driving circuits, so that the integrated discharging circuit can discharge to the two gate driving circuits at the same time. Since the number of the discharging circuits is reduced from four to two, the layout area of the shift register circuit used in the gate driving circuit of the display panel can be effectively decreased; therefore, the slim border requirement of the display panel can be easily achieved and the ultra high definition can be also achieved. Furthermore, the shift register circuit of the invention can also control the waveforms of the bidirectional gate driving signals to eliminate the configuration of dummy gate drivers in the conventional bidirectional shift register circuit; therefore, the stability and reliability of the entire gate driving circuit can be also enhanced.

The advantage and spirit of the invention may be understood by the following detailed descriptions together with the appended drawings.

DETAILED DESCRIPTION OF THE INVENTION

A preferred embodiment of the invention is a shift register circuit. In this embodiment, the shift register circuit is a bidirectional shift register circuit applied in a gate driving circuit of a TFT-LCD panel, but not limited to this. In fact, the thin-film transistors can be formed by amorphous silicon (a-Si) manufacturing process, low temperature poly-silicon (LTPS) manufacturing process, indium gallium zinc oxide (IGZO) manufacturing process or other manufacturing processes without any specific limitations.

Figure 2:
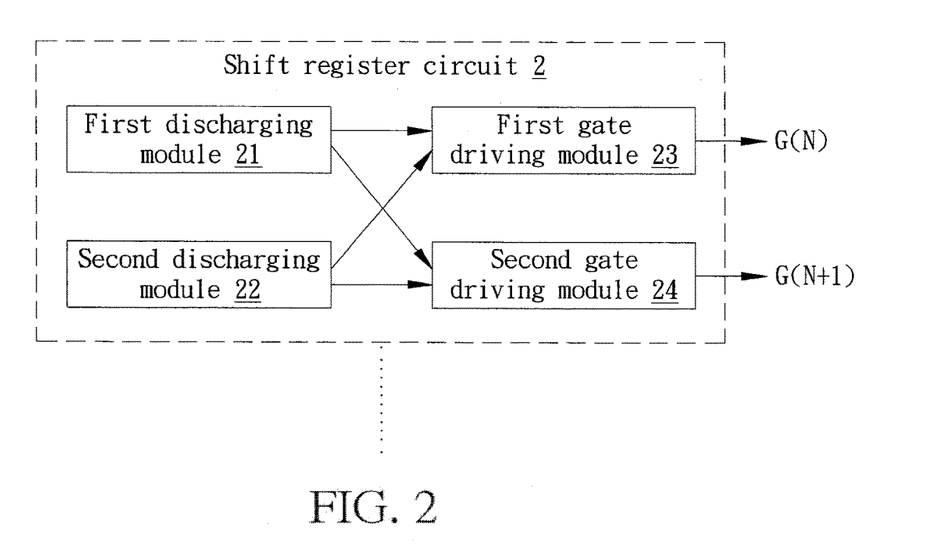
FIG. 2 illustrates a schematic diagram of the shift register circuit in a preferred embodiment of this invention.

Please refer to FIG. 2. FIG. 2 illustrates a schematic diagram of the shift register circuit in a preferred embodiment of this invention. As shown in FIG. 2, the shift register circuit 2 includes a first discharging module 21, a second discharging module 22, a first gate driving module 23 and a second gate driving module 24. Wherein, the first discharging module 21 is coupled to the gate driving module 23 and the second gate driving module 24 respectively, and the first discharging module 21 can discharge to the gate driving module 23 and the second gate driving module 24 at the same time; the second discharging module 22 is also coupled to the gate driving module 23 and the second gate driving module 24 respectively, and the second discharging module 22 can also discharge to the gate driving module 23 and the second gate driving module 24 at the same time.

It should be noted that the shift register circuit 2 including two gate driving modules 23~24 and two corresponding discharging modules 21~22 shown in FIG. 2 is only a simplest example for convenient explanation. In fact, a plurality of shift register circuits 2 can be configured in the gate driving circuit based on practical requirements and not limited by this case.

Compared to four discharging circuits 11~14 disposed in the conventional shift register circuit 1 shown in FIG. 1, there are only two discharging modules 21~22 disposed in the shift register circuit 2 of the invention. Therefore, the cost and the area of gate driving circuit layout can be effectively reduced.

Next, the first discharging module 21, the second discharging module 22, the first gate driving module 23 and the second gate driving module 24 of the shift register circuit 2 in FIG. 2 will be introduced in detail as follows.

Figure 3:
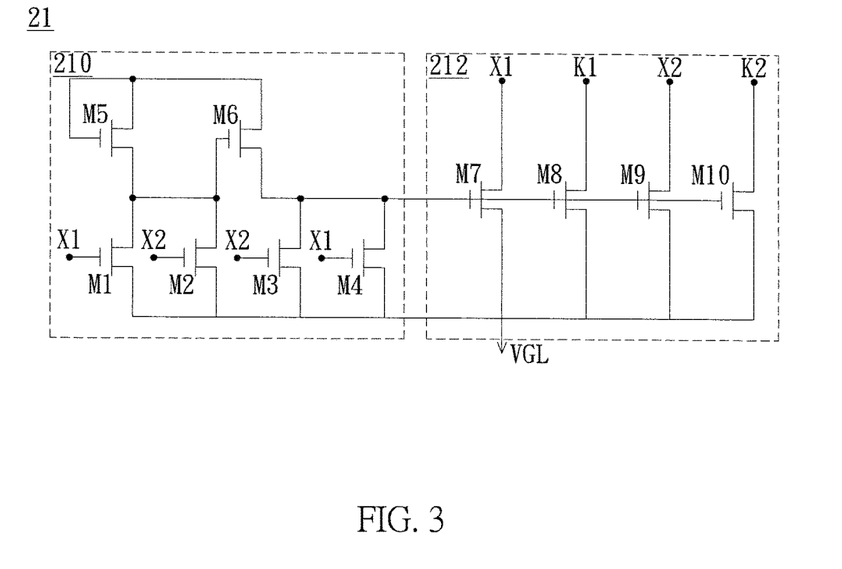
FIG. 3 illustrates a schematic diagram of the first discharging module in FIG. 2.
Figure 4:
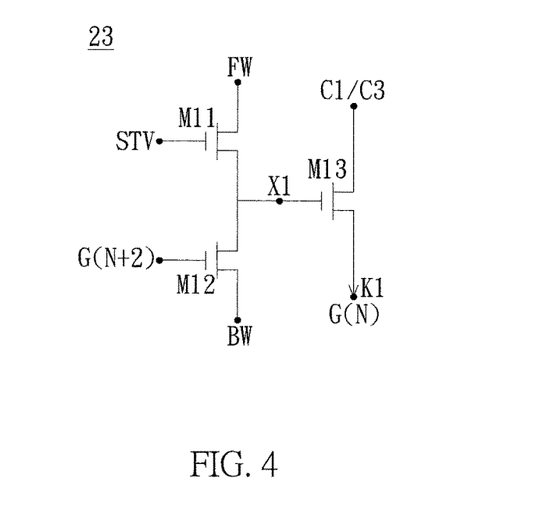
FIG. 4 illustrates a schematic diagram of the first gate driving module in FIG. 2.
Figure 5:
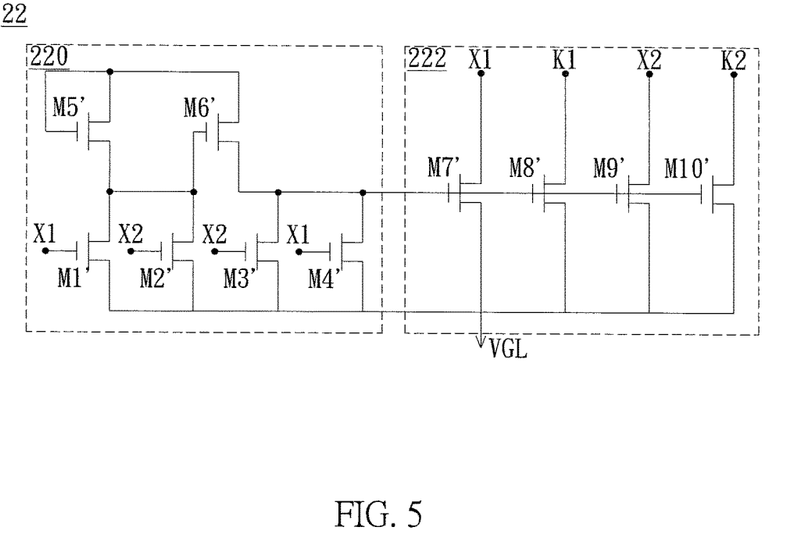
FIG. 5 illustrates a schematic diagram of the second discharging module in FIG. 2.
Figure 6:
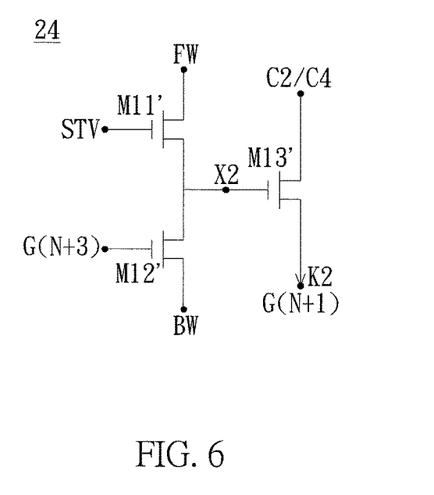
FIG. 6 illustrates a schematic diagram of the second gate driving module in FIG. 2.

Please refer to FIG. 3~FIG. 6. FIG. 3 illustrates a schematic diagram of the first discharging module 21 in FIG. 2; FIG. 4 illustrates a schematic diagram of the first gate driving module 23 in FIG. 2; FIG. 5 illustrates a schematic diagram of the second discharging module 22 in FIG. 2; FIG. 6 illustrates a schematic diagram of the second gate driving module 24 in FIG. 2.

As shown in FIG. 3 and FIG. 5, both the first discharging module 21 and the second discharging module 22 include ten transistors respectively. In fact, these transistors can be formed by a-Si manufacturing process, LTPS manufacturing process, IGZO manufacturing process, but not limited to these cases.

As shown in FIG. 3, the first discharging module 21 includes a discharge control unit 210 and a level pull-low unit 212 coupled to each other. The discharge control unit 210 includes a first transistor M1, a second transistor M2, a third transistor M3, a fourth transistor M4, a fifth transistor M5, and a sixth transistor M6 coupled to each other. The level pull-low unit 212 includes a seventh transistor M7, an eighth transistor M8, a ninth transistor M9 and a tenth transistor M10. Gate electrodes of the seventh transistor M7, the eighth transistor M8, the ninth transistor M9 and the tenth transistor M10 are all coupled to the discharge control unit 210.

The fifth transistor M5 is coupled to the first transistor M1 and a gate electrode of the fifth transistor M5 is coupled to the sixth transistor M6. The sixth transistor M6 is coupled to the second transistor M2, the third transistor M3 and the fifth transistor M5. A gate electrode of the sixth transistor M6 is coupled to the second transistor M2, the first transistor M1 and the fifth transistor M5. One terminal of the first transistor M1~the fourth transistor M4 and the seventh transistor M7~the tenth transistor M10 is all coupled to a pull low level VGL. Another terminal of the third transistor M3 and the fourth transistor M4 is coupled between a gate electrode of the seventh transistor M7 and the sixth transistor M6.

Similarly, as shown in FIG. 5, the second discharging module 22 includes a discharge control unit 220 and a level pull-low unit 222 coupled to each other. The discharge control unit 220 includes a first transistor M1', a second transistor M2', a third transistor M3', a fourth transistor M4', a fifth transistor M5', and a sixth transistor M6' coupled to each other. The level pull-low unit 222 includes a seventh transistor M7', an eighth transistor M8', a ninth transistor M9' and a tenth transistor M10'. Gate electrodes of the seventh transistor M7', the eighth transistor M8', the ninth transistor M9' and the tenth transistor M10' are all coupled to the discharge control unit 220.

The fifth transistor M5' is coupled to the first transistor M1' and a gate electrode of the fifth transistor M5' is coupled to the sixth transistor M6'. The sixth transistor M6' is coupled to the second transistor M2', the third transistor M3' and the fifth transistor M5' respectively. A gate electrode of the sixth transistor M6' is coupled to the second transistor M2', the first transistor M1' and the fifth transistor M5' respectively. One terminal of the first transistor M1'~the fourth transistor M4' and the seventh transistor M7'~the tenth transistor M10' is all coupled to a pull low level VGL. Another terminal of the third transistor M3' and another terminal of the fourth transistor M4' are both coupled between the sixth transistor M6' and a gate electrode of the seventh transistor M7'.

As shown in FIG. 4, the first gate driving module 23 includes an eleventh transistor M11, a twelfth transistor M12 and a thirteenth transistor M13, and the first gate driving module 23 has a first node X1 and a first output terminal K1. Wherein, the eleventh transistor M11 and the twelfth transistor M12 are coupled in series. A gate electrode of the thirteenth transistor M13 is coupled between the eleventh transistor M11 and the twelfth transistor M12 through the first node X1. The thirteenth transistor M13 is coupled to the first output terminal K1. The first output terminal K1 is used to output a first gate driving signal G(N).

As shown in FIG. 4, the second gate driving module 24 includes an eleventh transistor M11', a twelfth transistor M12' and a thirteenth transistor M13', and the second gate driving module 24 has a second node X2 and a second output terminal K2. Wherein, the eleventh transistor M11' and the twelfth transistor M12' are coupled in series. A gate electrode of the thirteenth transistor M13' is coupled between the eleventh transistor M11' and the twelfth transistor M12' through the second node X2. The thirteenth transistor M13' is coupled to the second output terminal K2. The second output terminal K2 is used to output a second gate driving signal G(N+1).

Back to FIG. 3, the gate electrodes of the first transistor M1 and the fourth transistor M4 and another terminal of the seventh transistor M7 in the first discharging module 21 are all coupled to the first node X1 in the first gate driving module 23; the gate electrodes of the second transistor M2 and the third transistor M3 and another terminal of the ninth transistor M9 are all coupled to the second node X2 in the second gate driving module 24; another terminal of the eighth transistor M8 in the first discharging module 21 is coupled to the first output terminal K1 in the first gate driving module 23; another terminal of the tenth transistor M10 in the first discharging module 21 is coupled to the second output terminal K2 in the second gate driving module 24.

In other words, the first discharging module 21 discharges to the first gate driving module 23 through the gate electrodes of the first transistor M1 and the fourth transistor M4 and the another terminal of the seventh transistor M7 coupled to the first node X1 in the first gate driving module 23 and the eighth transistor M8 coupled to the first output terminal K1 in the first gate driving module 23. At the same time, the first discharging module 21 also discharges to the second gate driving module 24 through the gate electrodes of the second transistor M2 and the third transistor M3 and the another terminal of the ninth transistor M9 coupled to the second node X2 in the second gate driving module 24 and the tenth transistor M10 coupled to the second output terminal K2 in the second gate driving module 24. By doing so, the first discharging module 21 can discharge to the first gate driving module 23 and the second gate driving module 24 at the same time.

Back to FIG. 5, the gate electrodes of the first transistor M1' and the fourth transistor M4' and another terminal of the seventh transistor M7' in the second discharging module 22 are all coupled to the first node X1 in the first gate driving module 23; the gate electrodes of the second transistor M2' and the third transistor M3' and another terminal of the ninth transistor M9' are all coupled to the second node X2 in the second gate driving module 24; another terminal of the eighth transistor M8' in the second discharging module 22 is coupled to the first output terminal K1 in the first gate driving module 23; another terminal of the tenth transistor M10' in the second discharging module 22 is coupled to the second output terminal K2 in the second gate driving module 24.

In other words, the second discharging module 22 discharges to the first gate driving module 23 through the gate electrodes of the first transistor M1' and the fourth transistor M4' and the another terminal of the seventh transistor M7' coupled to the first node X1 in the first gate driving module 23 and the eighth transistor M8' coupled to the first output terminal K1 in the first gate driving module 23. At the same time, the second discharging module 22 also discharges to the second gate driving module 24 through the gate electrodes of the second transistor M2' and the third transistor M3' and the another terminal of the ninth transistor M9' coupled to the second node X2 in the second gate driving module 24 and the tenth transistor M10' coupled to the second output terminal K2 in the second gate driving module 24. By doing so, the second discharging module 22 can discharge to the first gate driving module 23 and the second gate driving module 24 at the same time.

Figure 7:
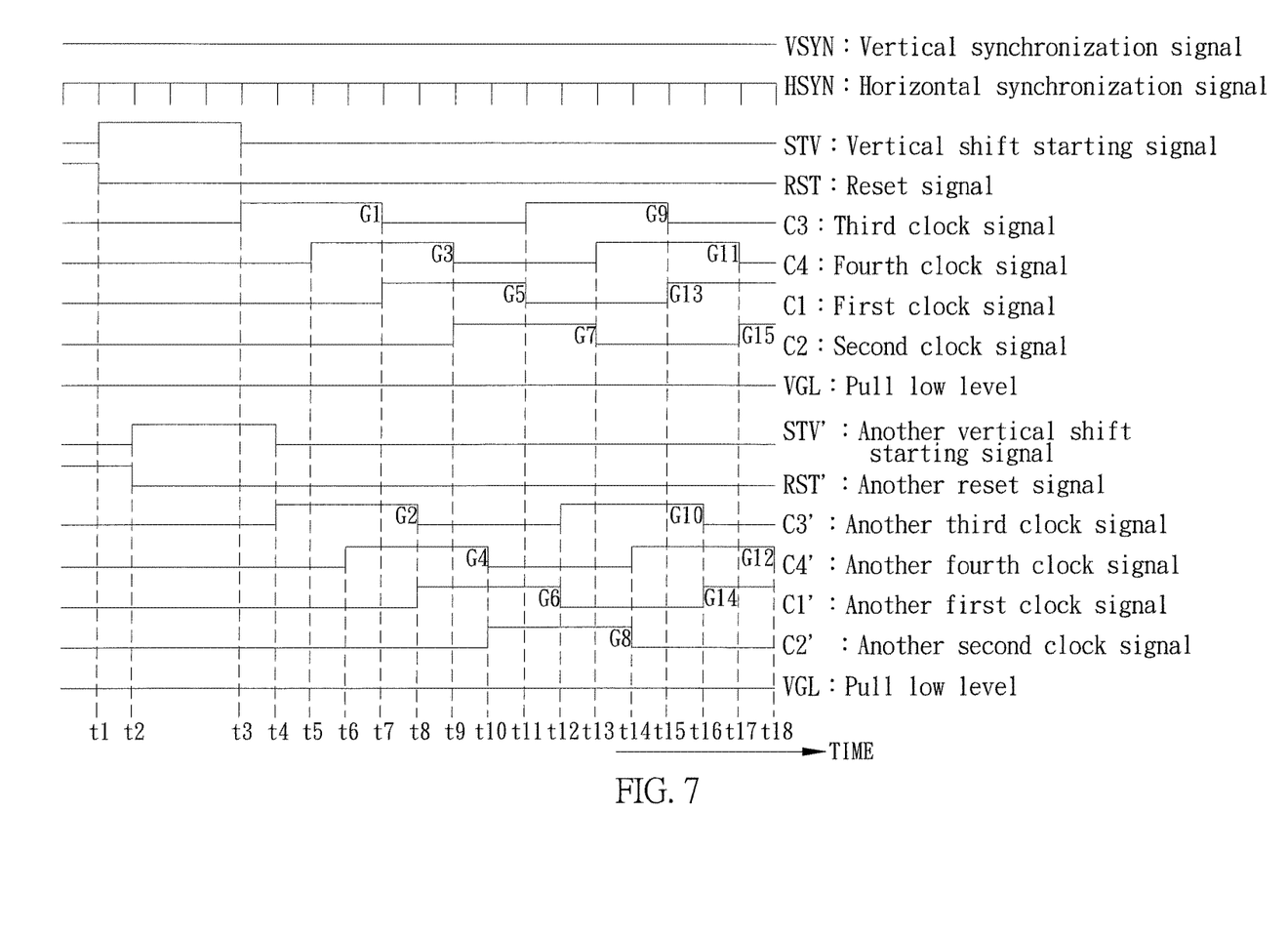
FIG. 7 illustrates a timing diagram of the forward gate driving signal.
Figure 8:
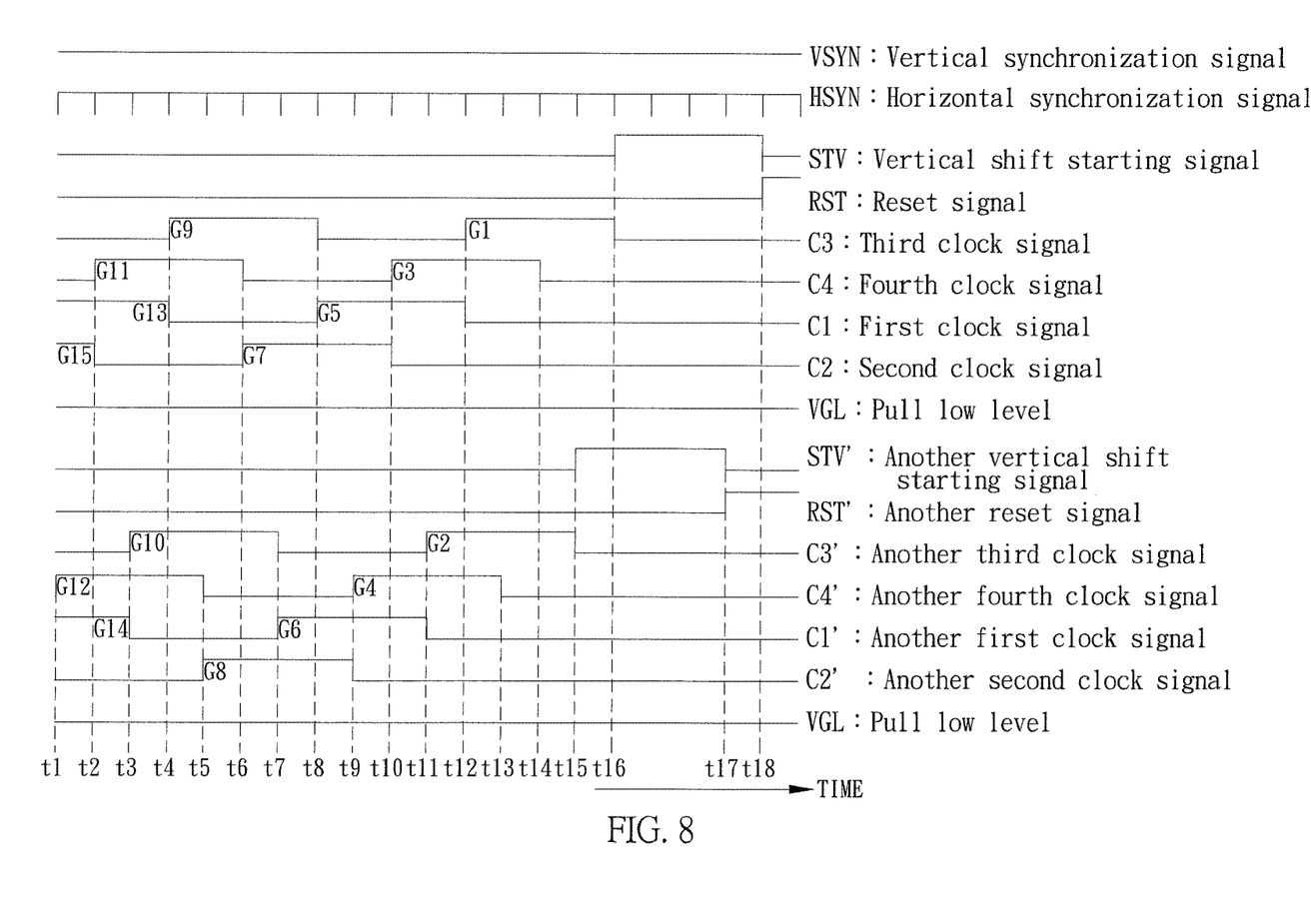
FIG. 8 illustrates a timing diagram of the backward gate driving signal.

Then, please refer to FIG. 7 and FIG. 8. FIG. 7 and FIG. 8 illustrate timing diagrams of the forward gate driving signal and the backward gate driving signal respectively.

As shown in FIG. 7, at a time t1, a reset signal RST is changed from the high level to the low level and a vertical shift starting signal STV is changed from the low level to the high level; at a time t2, another reset signal RST' is changed from the high level to the low level and another vertical shift starting signal STV' is changed from the low level to the high level. That is to say, the time t2 that the another reset signal RST' is changed from the high level to the low level and the another vertical shift starting signal STV' is changed from the low level to the high level will be later than the time t1 that the reset signal RST is changed from the high level to the low level and the vertical shift starting signal STV is changed from the low level to the high level, and the time difference between the time t2 and the time t1 is (t2−t1).

At a time t3, the vertical shift starting signal STV is changed from the high level to the low level and a third clock signal C3 is changed from the low level to the high level at this time, so that the first output terminal K1 in the first gate driving module 23 outputs a first gate driving signal G1; at a time t4, the vertical shift starting signal STV' is also changed from the high level to the low level and another third clock signal C3' is changed from the low level to the high level at this time, so that the second output terminal K2 in the second gate driving module 24 outputs a second gate driving signal G2.

At a time t5, a fourth clock signal C4 is changed from the low level to the high level, so that the first output terminal K1 in the first gate driving module 23 outputs a third gate driving signal G3; at a time t6, another fourth clock signal C4' is changed from the low level to the high level, so that the second output terminal K2 in the second gate driving module 24 outputs a fourth gate driving signal G4. At a time t7, the first clock signal C1 is changed from the low level to the high level, so that the first output terminal K1 in the first gate driving module 23 outputs a fifth gate driving signal G5, and the third clock signal C3 is also changed from the high level to the low level at this time; at a time t8, another first clock signal C1' is changed from the low level to the high level, so that the second output terminal K2 in the second gate driving module 24 outputs a sixth gate driving signal G6, and the another third clock signal C3' is also changed from the high level to the low level at this time.

At a time t9, a second clock signal C2 is changed from the low level to the high level, so that the first output terminal K1 in the first gate driving module 23 outputs a seventh gate driving signal G7, and a fourth clock signal C4 is also changed from the high level to the low level at this time; at a time t10, another second clock signal C2' is changed from the low level to the high level, so that the second output terminal K2 in the second gate driving module 24 outputs a eighth gate driving signal G8, and another fourth clock signal C4' is also changed from the high level to the low level at this time.

At a time t11, the third clock signal C3 is changed from the low level to the high level again, so that the first output terminal K1 in the first gate driving module 23 outputs a ninth gate driving signal G9, and the first clock signal C1 is also changed from the high level to the low level at this time; at a time t12, the another third clock signal C3' is changed from the low level to the high level again, so that the second output terminal K2 in the second gate driving module 24 outputs a tenth gate driving signal G10, and the another first clock signal C1' is also changed from the high level to the low level at this time.

At a time t13, the fourth clock signal C4 is changed from the low level to the high level, so that the first output terminal K1 in the first gate driving module 23 outputs an eleventh gate driving signal G11, and the second clock signal C2 is also changed from the high level to the low level; at a time t14, the another fourth clock signal C4' is changed from the low level to the high level, so that the second output terminal K2 in the second gate driving module 24 outputs a twelfth gate driving signal G12, and the another second clock signal C2' is also changed from the high level to the low level.

At a time t15, the first clock signal C1 is changed from the low level to the high level again, so that the first output terminal K1 in the first gate driving module 23 outputs a thirteenth gate driving signal G13, and the third clock signal C3 is also changed from the high level to the low level at this time; at a time t16, the another first clock signal C1' is changed from the low level to the high level again, so that the second output terminal K2 in the second gate driving module 24 outputs a fourteenth gate driving signal G14, and the another third clock signal C3' is also changed from the high level to the low level at this time.

At a time t17, the second clock signal C2 is changed from the low level to the high level, so that the first output terminal K1 in the first gate driving module 23 outputs a fifteenth gate driving signal G15, and the fourth clock signal C4 is also changed from the high level to the low level at this time; at a time t18, the another second clock signal C2' is changed from the low level to the high level, and the another fourth clock signal C4' is also changed from the high level to the low level at this time.

From FIG. 7 and the above-mentioned embodiments, it can be found that the forward gate driving signal timing means that the first output terminal K1 in the first gate driving module 23 and the second output terminal K2 in the second gate driving module 24 output the gate driving signals in an order of the first gate driving signal G1, the second driving signal G2, . . . , and the fifteenth gate driving signal G15. As to FIG. 8, the backward gate driving signal timing shown in FIG. 8 is opposite to the forward gate driving signal timing shown in FIG. 7. That is to say, the backward gate driving signal timing means that the first output terminal K1 in the first gate driving module 23 and the second output terminal K2 in the second gate driving module 24 output the gate driving signals in an order of the fifteenth gate driving signal G15, the fourteenth gate driving signal G14, . . . , and the first gate driving signal G1. Since it is similar to the above-mentioned embodiments, please refer to the above-mentioned embodiments and not repeated here.

It should be noted that the shift register circuit of the invention can eliminate the configuration of dummy gate drivers in the conventional bidirectional shift register circuit by controlling the waveforms of the bidirectional gate driving signals shown in FIG. 7 and FIG. 8, so that the light line or dark line issue on the screen of the display panel can be solved and the stability and reliability of the entire gate driving circuit can be also enhanced.

Compared to the prior art, the shift register circuit of the invention uses a novel gate driving circuit layout to integrate the discharging circuits of two gate driving circuits, so that the integrated discharging circuit can discharge to the two gate driving circuits at the same time. Since the number of the discharging circuits is reduced from four to two, the layout area of the shift register circuit used in the gate driving circuit of the display panel can be effectively decreased; therefore, the slim border requirement of the display panel can be easily achieved and the ultra high definition can be also achieved. Furthermore, the shift register circuit of the invention can also control the waveforms of the bidirectional gate driving signals to eliminate the configuration of dummy gate drivers in the conventional bidirectional shift register circuit; therefore, the stability and reliability of the entire gate driving circuit can be also enhanced.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A shift register circuit, comprising:
   a first gate driving module having a first node and a first output terminal;
   a second gate driving module having a second node and a second output terminal;
   a first discharging module comprising a discharge control unit and a level pull-low unit coupled to each other, configured to be coupled to the first node of the first gate driving module, the second node of the second gate driving module and the first output terminal of the first gate driving module respectively; and
   a second discharging module comprising a discharge control unit and a level pull-low unit coupled to each other, configured to be coupled to the second node of the second gate driving module, the first node of the first gate driving module, and the second output terminal of the second gate driving module respectively;
   wherein both of the first discharging module and the second discharging module each comprising ten transistors respectively; the discharge control unit of the first discharging module comprises a first transistor, a second transistor, a third transistor, a fourth transistor, a fifth transistor, and a sixth transistor coupled to each other; the fifth transistor of the first discharging module is configured to be coupled to the first transistor of the first discharging module and a gate electrode of the fifth transistor of the first discharging module is configured to be coupled to the sixth transistor of the first discharging module.

2. The shift register circuit of claim 1, wherein gate electrodes of the first transistor and the fourth transistor of the first discharging module are configured to be coupled to the first node of the first gate driving module.

3. The shift register circuit of claim 1, wherein gate electrodes of the second transistor and the third transistor of the first discharging module are configured to be coupled to the second node of the second gate driving module.

4. The shift register circuit of claim 1, wherein the level pull-low unit of the first discharging module comprises a seventh transistor, an eighth transistor, a ninth transistor and a tenth transistor; gate electrodes of the seventh transistor, the eighth transistor, the ninth transistor and the tenth transistor of the first discharging module are all coupled to the discharge control unit of the first discharging module.

5. The shift register circuit of claim 4, wherein the seventh transistor of the first discharging module is configured to be coupled to the first node of the first gate driving module and the eighth transistor of the first discharging module is configured to be coupled to the first output terminal of the first gate driving module.

6. The shift register circuit of claim 4, wherein the ninth transistor of the first discharging module is configured to be coupled to the second node of the second gate driving module and the tenth transistor of the first discharging module is configured to be coupled to the second output terminal of the second gate driving module.

7. A shift register circuit, comprising:
   a first gate driving module having a first node and a first output terminal;
   a second gate driving module having a second node and a second output terminal;
   a first discharging module comprising a discharge control unit and a level pull-low unit coupled to each other, configured to be coupled to the first node of the first gate driving module, the second node of the second gate driving module and the first output terminal of the first gate driving module respectively; and
   a second discharging module comprising a discharge control unit and a level pull-low unit coupled to each other, configured to be coupled to the second node of the second gate driving module, the first node of the first gate driving module, and the second output terminal of the second gate driving module respectively;
   wherein both of the first discharging module and the second discharging module each comprising ten transistors respectively; the discharge control unit of the first discharging module comprises a first transistor, a second transistor, a third transistor, a fourth transistor, a fifth transistor, and a sixth transistor coupled to each other; the sixth transistor of the first discharging module is configured to be coupled to the second transistor, the third transistor and the fifth transistor of the first discharging module; a gate electrode of the sixth transistor of the first discharging module is configured to be coupled to the second transistor, the first transistor and the fifth transistor of the first discharging module.

* * * * *